(12) United States Patent
Shumarayev et al.

(10) Patent No.: US 6,940,302 B1
(45) Date of Patent: Sep. 6, 2005

(54) INTEGRATED CIRCUIT OUTPUT DRIVER CIRCUITRY WITH PROGRAMMABLE PREEMPHASIS

(75) Inventors: Sergey Y. Shumarayev, San Leandro, CA (US); Thomas H. White, Santa Clara, CA (US); Rakesh H. Patel, Cupertino, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 262 days.

(21) Appl. No.: 10/338,921

(22) Filed: Jan. 7, 2003

(51) Int. Cl.$^7$ .............................. H03K 17/16
(52) U.S. Cl. ...................... 326/26; 326/38; 326/39; 326/83; 326/86; 326/115; 326/127
(58) Field of Search .................... 326/38–41, 26, 326/27, 83, 86, 115, 127

(56) References Cited

U.S. PATENT DOCUMENTS

| | | |
|---|---|---|
| 3,473,160 A | 10/1969 | Wahlstrom |
| 4,486,739 A | 12/1984 | Franaszek et al. |
| 4,527,079 A | 7/1985 | Thompson |
| 4,658,156 A | 4/1987 | Hashimoto |
| 4,853,560 A | 8/1989 | Iwamura et al. |
| 5,059,835 A | 10/1991 | Lauffer et al. |
| 5,067,007 A | 11/1991 | Otsuka et al. |
| 5,144,167 A | 9/1992 | McClintock |
| RE34,808 E | 12/1994 | Hsieh |
| 5,521,530 A | 5/1996 | Yao et al. |
| 5,557,219 A | 9/1996 | Norwood et al. |
| 5,589,783 A | 12/1996 | McClure |
| 5,689,195 A | 11/1997 | Cliff et al. |
| 5,742,178 A | 4/1998 | Jenkins, IV et al. |
| 5,801,548 A | 9/1998 | Lee et al. |
| 5,936,423 A | 8/1999 | Sakuma et al. |
| 5,939,904 A | 8/1999 | Fetterman et al. |
| 5,958,026 A | 9/1999 | Goetting et al. |
| 5,970,255 A | 10/1999 | Tran et al. |
| 6,175,952 B1 | 1/2001 | Patel et al. |
| 6,215,326 B1 | 4/2001 | Jefferson et al. |
| 6,236,231 B1 | 5/2001 | Nguyen et al. |

(Continued)

FOREIGN PATENT DOCUMENTS

EP  0 575 124  12/1993

OTHER PUBLICATIONS

"A-3.3-V Programmable Logic Device that Addresses Low Power Supply and Interface Trends," IEEE 1997 Custom Integrated Circuits Conference, May 1997, pp. 539-542.

(Continued)

*Primary Examiner*—Vibol Tan
(74) *Attorney, Agent, or Firm*—Fish & Neave IP Group of Ropes & Gray LLP; Robert R. Jackson; Hong S. Lin

(57) ABSTRACT

Programmable logic device integrated circuitry having differential I/O circuitry is provided. The differential I/O circuitry may include output drivers for providing differential digital output data signals across pairs of output lines. A user may program the I/O circuitry to accommodate different high-speed differential I/O signaling standards. The user may also program the I/O circuitry to provide a desired amount of preemphasis to the output data signals.

15 Claims, 7 Drawing Sheets

U.S. PATENT DOCUMENTS

| | | | |
|---|---|---|---|
| 6,252,419 | B1 | 6/2001 | Sung et al. |
| 6,271,679 | B1 | 8/2001 | McClintock et al. |
| 6,366,128 | B1 * | 4/2002 | Ghia et al. ............... 326/83 |
| 6,400,598 | B1 | 6/2002 | Nguyen et al. |
| 6,407,576 | B1 | 6/2002 | Ngai et al. |
| 6,433,579 | B1 | 8/2002 | Wang et al. |
| 6,686,772 | B2 * | 2/2004 | Li et al. ............... 326/83 |
| 6,812,733 | B1 * | 11/2004 | Plasterer et al. ............... 326/30 |
| 2002/0190751 | A1 | 12/2002 | Lee et al. |
| 2004/0113656 | A1 * | 6/2004 | Sato ............... 326/86 |

OTHER PUBLICATIONS

"APEX20KC Programmable Logic Device Data Sheet", Apr. 2002 ver. 2.1, pp. 1-6 & 36-48.

"APEX II Programmable Logic Device Family Data Sheet", Apr. 2001, ver. 1.0, pp. 24-38.

"Block Diagram for NSM LVDS Output Buffer", "Circuit Trace from National Semiconductor Device", National Semiconductor Corporation, no date.

"Lucent Introduces 10Gb/s Ethernet FPGAs", Programmable Logic News and Views, Electronic Trend Publications, Inc., vol. IX, No. 11, Nov. 2000, pp. 7-8.

"LVDS Owner's Manual; Design Guide", National Semiconductor Corporation, Spring 1997, Chapter 1, pp. 1-7, no month.

Mecury Programmable Logic Device Family Data Sheet, Mar. 2002, ver. 2.0, pp. 1-2,& 47-60.

"ORCA ORT82G5 0.622/1.0-1.25/2.0-2.5/3.125 Gbits/s Backplane Interface FPSC", Product Brief, Feb. 2001, Lucent Technologies Inc., pp. 1-8.

"Protocol Independent Gigabit Backplane Transceiver Using Lucent ORT4622/ORT8850 FPSCs", Application Note, Jun. 2000, Lucent Technologies Inc., pp. 1-10.

"Using HSDI In Source-Synchronous Mode in Mercury Devices, Application Note 159", Altera Corporation, Sep. 2001, ver. 1.0., pp. 1-60.

"Using Phase Locked Loop (PLLs) in DL6035 Devices, Application Note", Dyna Chip Corporation, Sunnyvale, CA, 1998, pp. i and 1-6, no date.

"Using the Virtex Delay-Locked Loop, Application Note, XAPP132, Oct. 21, 1998 (Version 1.31)", Xilinx Corporation, Oct. 21, 1998, pp. 1-14.

"Virtex™-E 1.8V Field Programmable Gate Arrays Preliminary Product Specification", Xilinx, DS022-2 (vs.3), Nov. 9, 2001, pp. 1-3 & 30-52.

"Virtex-II 1.5V Field-Programmable Gate Arrays Advance Product Specification", Xilinx, DS031-2(v2.0), Jul. 16, 2002.

"Virtex 2.5V Field Programmable Gate Arrays, Advanced Product Specification, Oct. 20, 1998 (Version 1.0)", Xilinx Corporation, Oct. 20, 1998, pp. 1-24.

DY6000-Family, FAST Field Programmable Gate Array, DY6000 Family Datasheet, Dyna Chip Corporation, Sunnyvale, CA, Dec. 1998, pp. 1-66.

Optimized Reconfigurable Cell Array (ORCA), OR3Cxxx/OR3Txxx Series Field-Programmable Gate Arrays, Preliminary Product Brief, Lucent Technolgies Inc., Microelectronics Group, Allentown, PA, Nov. 1997, pp. 1-7 and unnumbered back cover.

ORCA Series 3 Field-Programmable Gate Arrays, Preliminary Data Sheet, Rev. 01, Lucent Technologies Inc., Microelectronics Group, Allentown, PA, Aug. 1998, pp. 1-80.

Rocket I/O Transceiver User Guide, UG024 (vl.2) Feb. 25, 2002, Xilinx, Inc., pp. 1-106.

Virtex-II Pro Platform FPGA Handbook, UG012 (vl.0) Jan. 31, 2002, Xilinx, Inc., pp. 1-6, 27-32, 121-126, and 162-180.

* cited by examiner

| A | A' | X |
|---|----|---|
| 0 | 0  | 0 |
| 1 | 1  | 0 |
| 0 | 1  | 1 |
| 1 | 0  | 1 |

| A | $\bar{A}$ | $V_{OUT}$ |
|---|-----------|-----------|
| 0 | 1         | −         |
| 1 | 0         | +         |

INTEGRATED CIRCUIT OUTPUT DRIVER CIRCUITRY WITH PROGRAMMABLE PREEMPHASIS

BACKGROUND OF THE INVENTION

This application relates to circuitry for integrated circuits such as programmable logic array integrated circuits ("programmable logic devices"), and more particularly, to programmable output driver circuitry with the capability to provide adjustable amounts of preemphasis.

Programmable logic devices are integrated circuits that may be programmed by a user to perform various logic functions. Programmable logic devices may have differential (two-pin) input-output ("I/O") circuitry for handling high-speed (I/O) signals. Some currently-available programmable logic devices with differential input-output circuitry use output drivers with a fixed (non-programmable) preemphasis feature and have input-output driver circuitry that may be selectively configured to accommodate different communications standards. The preemphasis capabilities that are provided by these output drivers help to drive high-speed signals over communications paths that are used to convey data between various system components. A user of this type of device may configure the programmable circuitry so that the peak-to-peak voltage and average voltage of the input-output signals match those specified for a particular desired signaling standard. These devices may therefore be configured to handle different high-speed differential signaling standards.

Another type of currently-available programmable logic device has programmable preemphasis circuitry that applies preemphasis signals of different durations to its high-speed output signals depending on which high-speed differential signaling standard is selected by the user. The current supply circuitry in the preemphasis circuitry in this type of device is not programmable and therefore does not provide programmable slope steepening effects at the leading and trailing edges of the I/O signals.

It is an object of the present invention to provide integrated circuit devices such as programmable logic devices that have input-output circuitry with enhanced programmable output driver preemphasis capabilities.

SUMMARY OF THE INVENTION

This and other objects of the invention are accomplished in accordance with the principles of the invention by providing a programmable logic device having input-output driver circuitry with programmable preemphasis capabilities. A user may program the driver circuitry to provide a desired amount of output signal preemphasis. The output driver circuitry can therefore be configured as needed to best accommodate particular system line conditions. The driver circuitry may be programmed to adjust the amount of slope steepening that is provided at data bit transitions in the differential output data signal or to adjust the duration of the preemphasis contribution to each bit. The driver circuitry may also be selectively configured to accommodate different I/O signaling standards. For example, the peak-to-peak voltage and average (common-mode) voltage that is handled by the input-output circuitry may be programmed as desired by the user.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
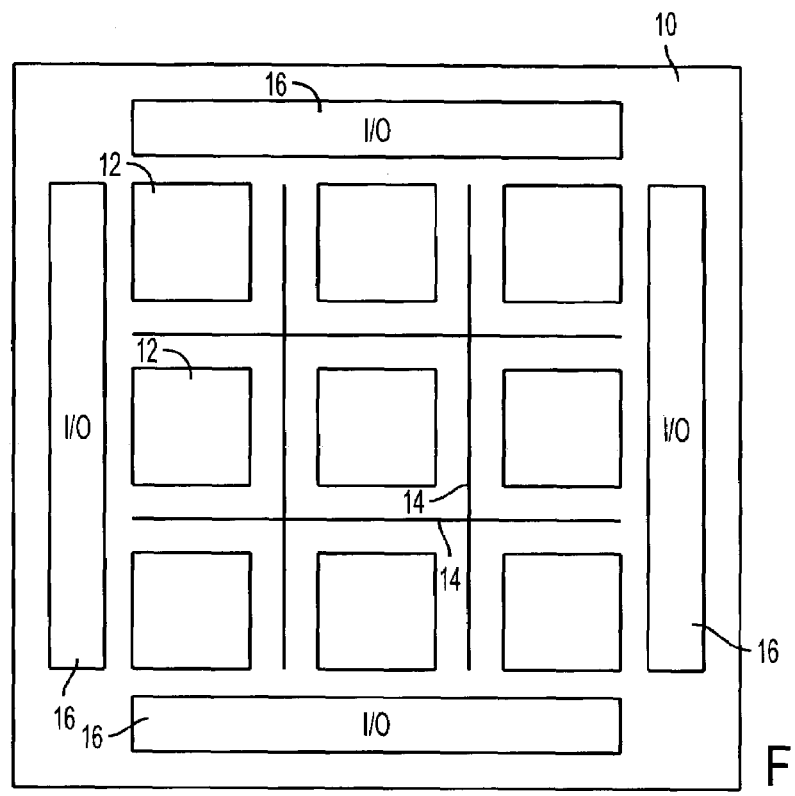
FIG. 1 is a simplified block diagram of an illustrative programmable logic device that can be constructed in accordance with the invention.

An illustrative programmable logic device 10 that can be constructed in accordance with this invention is shown in FIG. 1. Device 10 may have a number of rows and columns of regions 12 of programmable logic. Regions 12 may be disposed on device 10 in a two-dimensional array of, for example, 5–300 rows and 5–300 columns of regions 12 or any other suitably-sized array.

The logic in regions 12 may be interconnected using interconnection resources such as vertical and horizontal conductors 14. Such conductors may, for example, include relatively large inter-region conductors that extend past all or some of the logic regions 12 in a row or column. There may be any suitable number of conductors 14. For example, there may be about 10–30 conductors 14 in each row and each column of regions 12. Programmable logic may be used to selectively connect all or a subset of the conductors 14 in each row or column to the associated logic regions 12 in that column. If desired, programmable logic may also be used to directly interconnect the vertical and horizontal conductors 14. The conductors 14 may be continuous or segmented and, if segmented, may be programmably connected to serve as continuous conductors.

Input-output circuitry 16 may be used to interconnect the logic of device 10 to external components (e.g., through I/O pads connected to pins in a package). Additional circuitry may also be used such as circuitry for programming and testing device 10. To avoid over-complicating the drawing, details of the programmable logic interconnections and programming and testing circuitry of device 10 are not shown in FIG. 1. Moreover, the arrangement of FIG. 1 is merely illustrative. Any suitable programmable logic device architecture may be used for device 10 if desired.

Programmable logic device 10 may be shipped to a customer ("user") in a substantially unprogrammed condition. The customer may use equipment (referred to as a device "programmer") to program or configure the device 10 so that device 10 performs a desired custom logic function and so that the input-output circuitry 16 provides desired I/O functionality. Sometimes two or more conductors must be selectively connected to a third conductor. This type of function may be performed using programmable logic connectors ("PLCs"). An example of a PLC is a programmable multiplexer. Programmable logic connectors and other components on device 10 are typically controlled by programmable function control elements ("FCEs"). A programmable function control element may, for example, be based on a programmable cell. Programmable function control elements are designated by the letter "R" in the drawings.

The programmable logic connectors and function control elements on device 10 may be configured by a user to implement desired logic functions on programmable logic device 10 and to configure the input-output circuitry. For example, the state of a two-input multiplexer may be controlled by programming an associated FCE to output either a "0" or a "1." If the FCE supplies a "0," the first input of the multiplexer will be connected to its output. Programming the FCE so that the FCE supplies a "1," will direct the multiplexer to connect its second input to its output. Components such as current sources, delay generators, and other circuitry may also be programmably controlled by FCEs.

Figure 2:
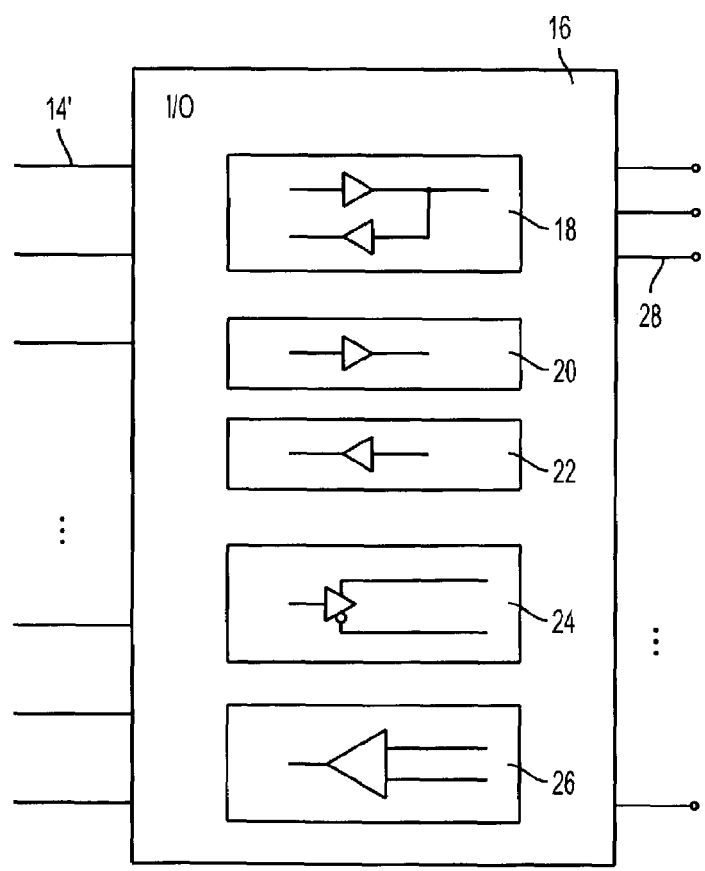
FIG. 2 is a schematic diagram that shows the types of input-output drivers that may be contained in illustrative input-output circuitry in a programmable logic device in accordance with the invention.

Illustrative input-output circuitry 16 that may be used with programmable logic device 10 is shown in FIG. 2. Signals may be routed to and from regions of programmable logic and other circuitry on device 10 using lines 14'. Lines 14' may be part of lines 14 of FIG. 1 or may be directly or indirectly connected to such interconnection resources.

Circuitry such as driver circuits 18, 20, 22, 24, and 26 may be used as drivers (sometimes called buffers) for input and output signals routed between lines 14' and I/O lines 28. I/O lines 28 may have I/O pads that are electrically connected to I/O pins in an integrated circuit package. (The terms I/O lines, I/O pads, and I/O pins may sometimes be used interchangeably for the purposes of this description.) Any suitable number of I/O lines 28 may be associated with a given programmable logic device 10. As an example, there may be between 20–300 or 50–200 I/O lines 28 for a single device 10.

Driver circuit 20 is a single-ended output driver that may be used to drive a signal from one of lines 14' onto an associated output line 28. Driver circuit 22 is a single-ended input driver.

Driver circuit 18 has both input and output capabilities and can be programmably configured to operate as either an single-ended input driver or a single-ended output driver.

Differential drive circuitry may be used to handle high-speed signals such as signals with data rates in the Gbps range. With a differential output driver circuit 24, digital data signals on a single internal signal conductor 14' may be converted into differential digital data signals on two associated I/O lines 28.

Driver circuit 26 is a differential input circuit that converts differential input signals on a pair of I/O lines 28 into a single signal that is provided to one of lines 14'.

Input-output circuitry 16 may use driver circuits such as the driver circuits shown in FIG. 2 or any other suitable driver circuits to handle input-output functions for programmable logic device 10.

High-speed output signals may experience attenuation due to the attributes of the communications busses or paths onto which the output signals are driven during operation of device 10 in a system. For example, device 10 may be used to support communications between components on different boards in a system rack. The backplane in this type of system will have relatively long signal paths for interconnecting the boards. Due to the impedances and lengths of these paths, the signals (and particularly the high-frequency components of such signals) may be attenuated as they are launched onto and travel along the paths.

To compensate for the attenuation of the high-frequency signal components of the output signals, the output signals may be provided with preemphasis before they are launched onto the signal paths via I/O lines 28. The preemphasis, which is a relatively small amount of extra signal superimposed on top of the regular signal at the edges of each digital data bit, helps to offset high-frequency attenuation effects, thereby producing less attenuated and cleaner signals.

Because the conditions on the inter-device signal paths in a system are not all the same, the amount of preemphasis that is appropriate for one path (e.g., a long lossy path) may not be the amount of preemphasis that is appropriate for another path (e.g., a short path that is not lossy). Moreover, different signaling standards may be used by different users. The choice of a particular standard may also affect the desired amount of preemphasis to be used. Because the appropriate amount of preemphasis to be used in a given situation may be a function of the type of communications path involved, the type of signaling standard used, and other factors, the amount of preemphasis provided by circuitry 16 is preferably programmable.

Figure 3:
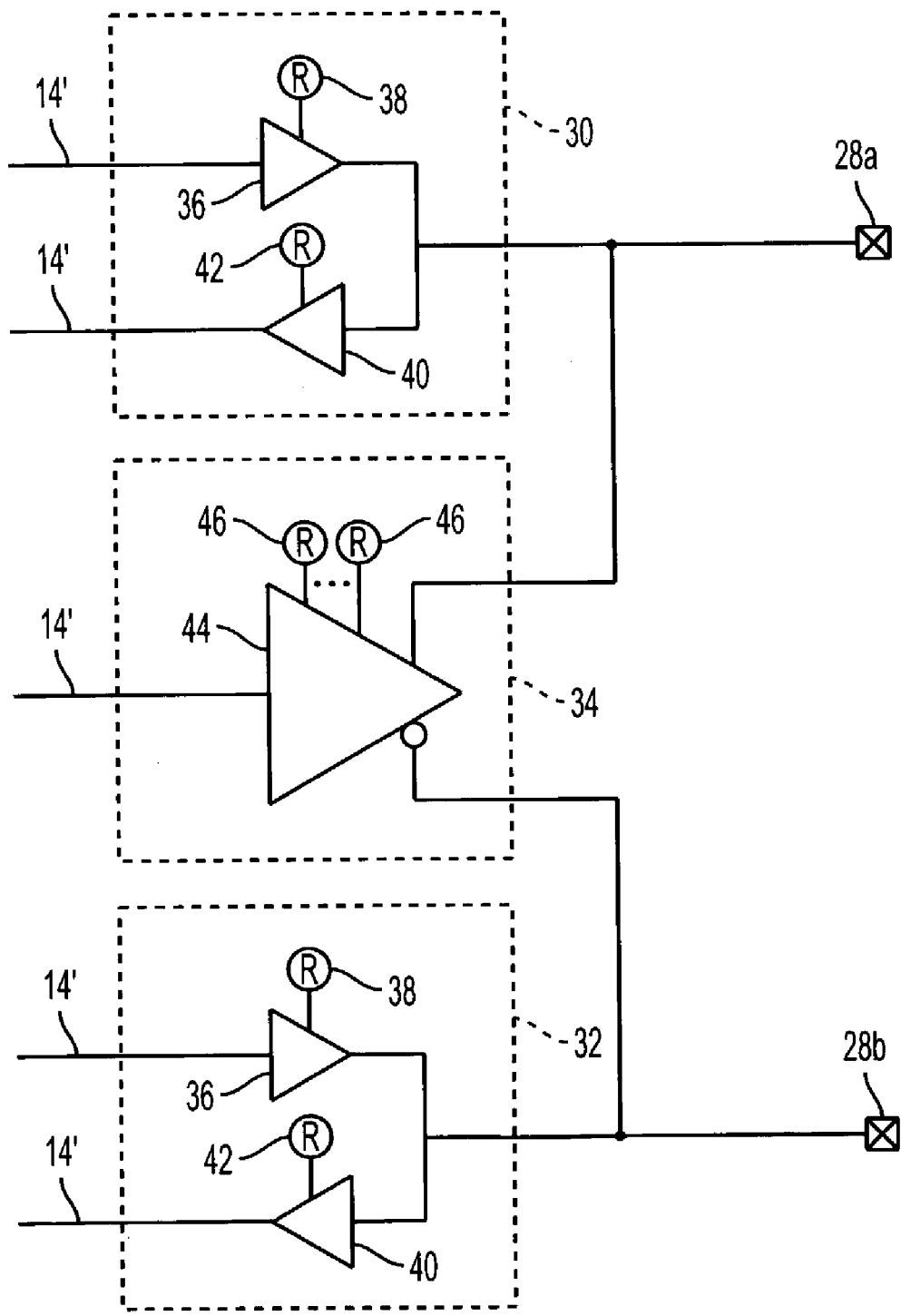
FIG. 3 is a circuit diagram of an illustrative output driver circuit in accordance with the present invention.

A circuit diagram of illustrative I/O circuitry 16 that may be used to provide a programmable amount of output preemphasis is shown in FIG. 3. Circuitry 16 may be used to handle I/O signals passing between internal signal lines 14' (which are connected to the functional logic on device 10) and I/O lines such as I/O line 28a and I/O line 28b. In the example of FIG. 3, circuitry 16 has programmable single-ended driver circuit portions 30 and 32 and differential output driver circuitry portion 34. Driver circuits 30 and 32 include output drivers 36, which are programmably configured using function control elements 38. Driver circuits 30 and 32 also include input drivers 40, which are programmably configured using function control elements 42. Differential output driver circuitry 34 has a differential output driver 44 that may be programmably configured using function control elements 46.

In single-ended operation, differential driver 44 may be turned off using function control elements 46 and the appropriate input or output drivers 36 and 40 may be used to convey signals between lines 14' and respective I/O lines 28a and 28b. With this configuration, each I/O line may handle a different digital data stream.

In differential operation, the single-ended drivers in circuit portions 30 and 32 may be disabled (e.g., by programming FCEs 38 and 42 appropriately). A single stream of digital output data bits may be driven differentially onto the pair of I/O lines 28a and 28b using driver 44. By using a differential mode of operation, a higher data rate may be supported over the communications paths of the system than is generally possible using single-ended I/O configurations.

Function control elements 46 may be used to adjust various settings associated with differential output driver 44. Due to system constraints such as the varying lengths and impedances of the system-level communications paths, the required data rates for these paths, compatibility requirements with other equipment in the system, and system design preferences, different systems may use different differential signaling standards. Illustrative high-speed differential I/O signaling standards that may be supported by input output circuitry 16 include the low-voltage pseudo-emitter-coupled logic (LVPECL) standard, the pseudo current mode logic (PCML) standard, and the low-voltage differential signaling (LVDS) standard. Additional standards such as LTD, CML, or any other suitable communications standards may also be supported or any suitable subset of such standards may be supported if desired.

Figure 4:
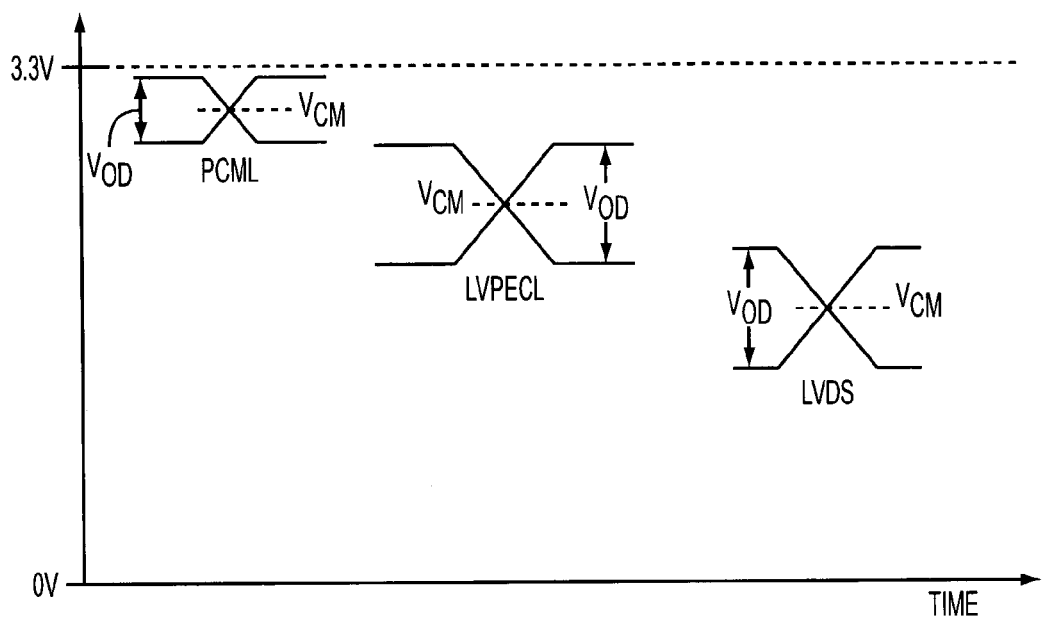
FIG. 4 is a graph showing the different signal levels associated with illustrative high-speed differential input-output signaling standards that may be accommodated by appropriately configuring the input-output circuitry in accordance with the present invention.

The signal levels associated with the PCML, LVPECL, and LVDS differential I/O standards are shown in the graph of FIG. 4. As shown in FIG. 4, the peak-to-peak voltage swing ($V_{OD}$) and the average or common-mode voltage ($V_{CM}$) associated with each standard is generally different. Function control elements 46 may be programmably adjusted by a user to configure differential output driver 44 to produce appropriate signal levels on pins 28a and 28b as required for the I/O standard desired by the user.

Figure 5A:
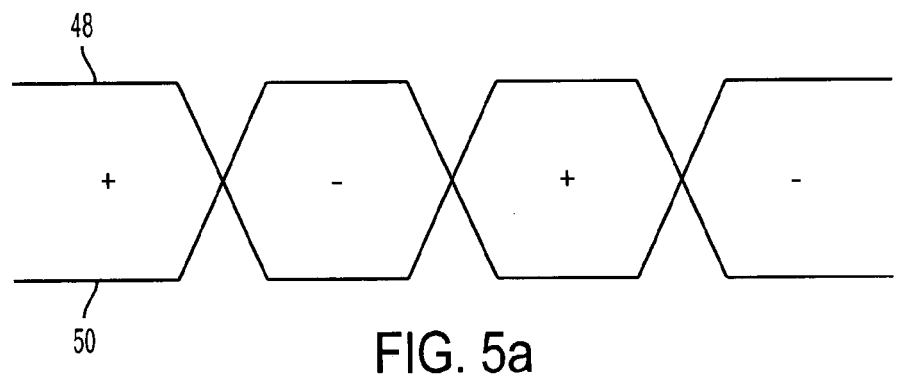
FIG. 5a is a diagram of an illustrative differential digital output data signal without preemphasis in accordance with the present invention.

Traces for the differential signals on pin 28a (trace 48) and pin 28b (trace 50) for an illustrative stream of digital output data bits when an output driver is used that is not producing output signal preemphasis is shown in FIG. 5a. The high-frequency components of this type of signal (without preemphasis) may be susceptible to undesirable attenuation due to the filtering effects of the communications paths over which the signals travel (e.g., the paths between devices on a board or between devices on different boards in a system). The "+" and "−" signs on the graph of FIG. 5a indicate which bits are positive (e.g., logic ones) and which bits are negative (e.g., logic zeros).

Figure 5B:
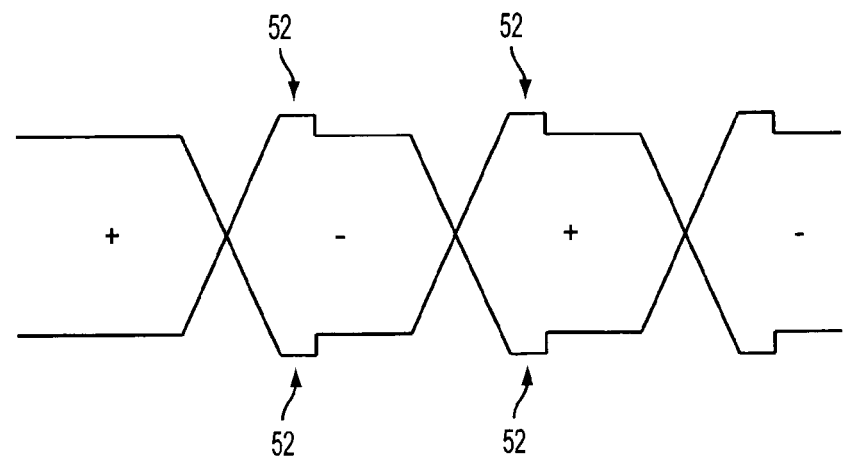
FIG. 5b is a diagram of an illustrative differential digital output data signal to which output preemphasis has been added in accordance with the present invention.

In the example of FIG. 5b, a preemphasis signal component has been added to the edges of the data bits. The addition of the preemphasis to the data signal results in faster low-to-high and high-to-low transitions (steeper leading-edge and trailing-edge slopes for the bits) and results in additional signal components 52 above and below the normal maximum and minimum voltage levels for the signal data. Using preemphasis allows higher-data-rate signals to be sustained through the system than would otherwise be possible.

Function control elements such as function control elements 46 of FIG. 3 may be used to adjust output driver settings such as $V_{OD}$ and $V_{CM}$ (to make the I/O circuitry 16 compatible with a desired I/O signaling standard) and to adjust the amount of preemphasis that the driver 44 produces.

The amount of preemphasis that is produced by the output driver circuitry 44 in the I/O circuitry 16 may be adjusted using any suitable programmable circuit arrangement. Parameters such as amount of slope correction (slope steepening) that is produced on the leading and trailing edges of the data bits and the amount of time that the additional preemphasis component is added may be adjusted if desired.

Figure 6:
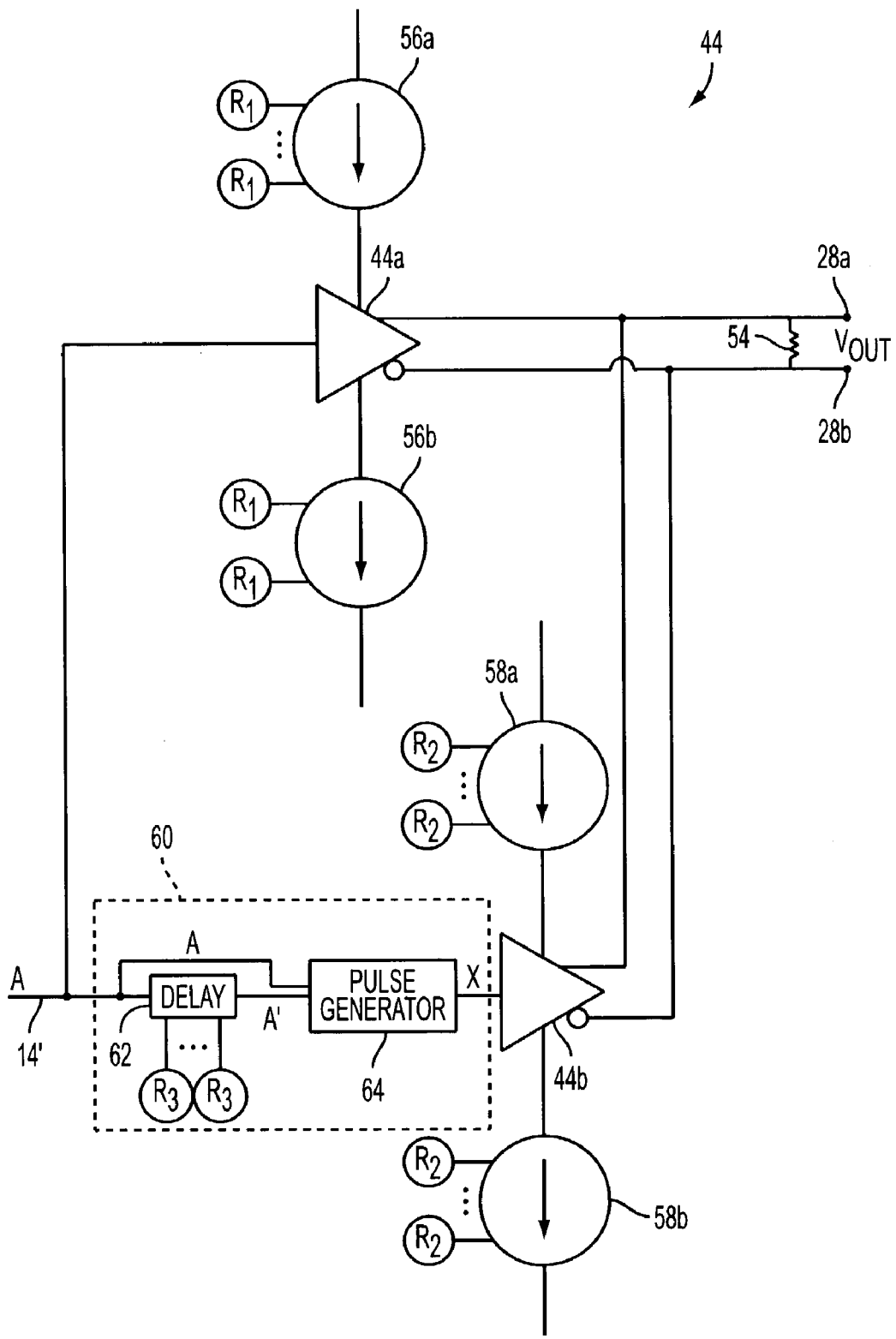
FIG. 6 is a schematic diagram of illustrative programmable output driver circuitry in accordance with the present invention.

An illustrative differential output driver 44 in which the amount of preemphasis may be programmably adjusted is shown in FIG. 6. In the arrangement of FIG. 6, digital output data signals A from the logic on programmable logic device 10 are provided on line 14'. Corresponding differential digital data output signals $V_{OUT}$ are provided by driver circuitry 44 across output resistor 54.

Output driver 44 may have a main driver 44a that differentially drives signal A across pins 28a and 28b and a preemphasis driver 44b that provides a programmable amount of preemphasis on top of the main output signal.

Main driver circuitry 44a may have associated programmable current supplies 56a and 56b. Function control elements $R_1$ may be used to adjust the settings of current supplies 56a and 56b (e.g., by selectively switching a larger or smaller number of transistors in supplies 56a on or off or by adjusting the bias on suitable transistor gates—the other current supplies in the drawings may be adjustably controlled in the same way). By adjusting the operation of the main driver current supplies, a user may adjust the values of the parameters $V_{OD}$ and $V_{CM}$ for the differential output signal $V_{OUT}$. In this way, the user may program the function control elements $R_1$ to accommodate high-speed (typically greater than 1 Gbps) differential I/O standards such as LVPECL, LVDS, PCML, etc.

Preemphasis driver circuitry 44b may have associated current supplies 58a and 58b. The amount of current that is produced by supplies 58a and 58b may be controlled by programming function control elements $R_2$. When a relatively large amount of current is produced, the impact on the leading and trailing edges of the data bits (e.g., the amount of steepening of the leading and trailing edge slopes) is the greatest. If a user programs function control elements $R_2$ so that current supplies 58a and 58b produce small currents, the impact of the preemphasis on the slopes of the data bit edges will be correspondingly modest.

Preemphasis driver 44b may also have associated pulse generator circuitry 60. In the illustrative arrangement of FIG. 6, circuitry 60 has a programmable delay circuit 62 and a pulse generator 64. The amount of delay that is produced by delay circuit 62 (and therefore the length of the preemphasis pulse that is produced by preemphasis driver 44b) may be adjusted by programming function control elements $R_3$.

Figures 7, 8, 9:
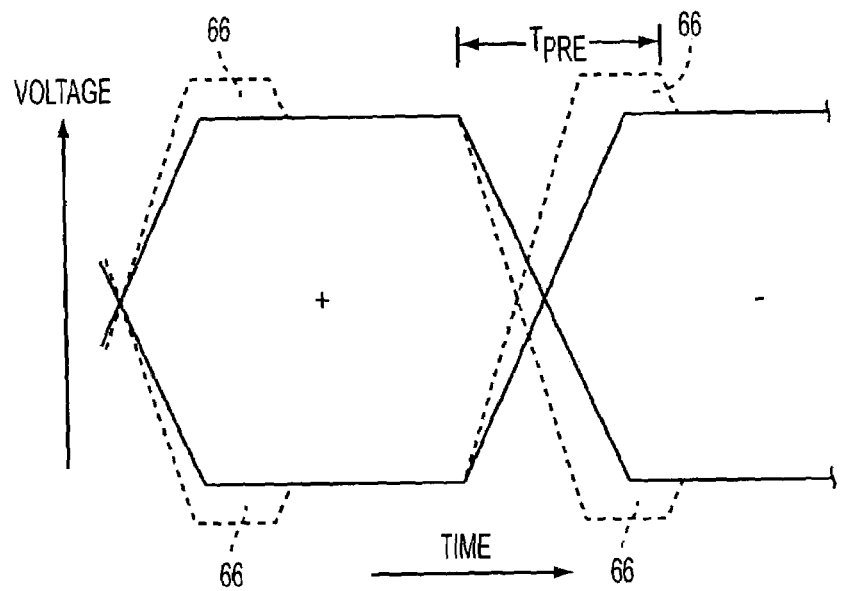
FIG. 7 is a signal diagram that compares the signal traces of differential output signals with and without output preemphasis in accordance with the present invention.
FIG. 8 is a table showing the relationship between the drive signal A, a delayed version of the drive signal A' and a control signal X that is used in the operation of the circuitry of FIG. 6 in accordance with the present invention.
FIG. 9 is a table showing the relationship between the polarity of the output signal $V_{OUT}$ produced by the circuit of FIG. 6 and the drive signal A in accordance with the invention.

A graph of an illustrative data signal that may be produced across I/O lines 28a and 28b is shown in FIG. 7. Two bits are shown: a positive or logic one bit denoted by a "+" symbol and a negative or logic zero bit denoted by a "−" symbol. The solid lines in FIG. 7 correspond to the differential output signal that is produced by main driver 44a of FIG. 6 when no preemphasis is present (i.e., when preemphasis driver 44b is deactivated by appropriate programming of function control elements $R_2$ and $R_3$). The dotted lines in FIG. 7 correspond to the differential output signal when a programmable amount of preemphasis has been contributed by preemphasis driver 44b.

As shown by the signal traces in FIG. 7, the effect of preemphasis is to steepen the leading edge and trailing edge differential signal slopes (i.e., the speed with which high-to-low and low-to-high transitions are made) and to add additional high-frequency preemphasis components 66. The magnitude of the current produced by current sources 58a and 58b of FIG. 6 that is adjusted by function control elements $R_2$ affects the amount of slope steepening that is produced. The magnitude of the preemphasis duration $T_{PRE}$ is adjusted by appropriate programming of the duration of the delay time produced by delay circuitry 60 of FIG. 6. As an example, the magnitude of the preemphasis duration may be selectively adjusted to be 100 ps, 200 ps, 300 ps, or 500 ps, as desired by the user. These preemphasis times are generally substantially shorter than the duration of each of the bits in the differential digital output data stream (which may each be, for example, 1000 ps in length). These are merely illustrative delay amounts. Other suitable delay times in the range of 100–500 ps or larger or smaller delay time ranges may be used if desired. For example, when higher output data rates are supported, the duration of the output data bits will be reduced correspondingly and the preemphasis times that are used will also be reduced.

As shown in FIG. 6, the preemphasis duration $T_{PRE}$ may be measured from the point at which a high-to-low or low-to-high transition begins (i.e., when the preemphasis driver 44b is first turned on) to the time at which the preemphasis driver 44b is turned off. The flat tops characteristic of the preemphasis portions 66 are produced when the current sources 58a and 58b reach steady-state conditions.

In the illustrative delay circuitry 60 of FIG. 6, data output signals A are delayed by delay circuit 62 to produce delayed signals A'. The amount of delay that is produced by delay circuit 62 (which directly affects the duration of the preemphasis, $T_{PRE}$) is programmably controlled by function control elements $R_3$. The original signal A and the delayed version of this signal A' are provided as inputs to pulse generator 64. When the signal A and the signal A' have the same logic value (i.e., when the output signal is not in a high-to-low or low-to-high transition), the output X of pulse generator 64 is a logic 0. When the values of A and A' differ (because a high-to-low or a low-to-high transition is occurring), the output X of pulse generator 64 is a logic 1. A table showing the relationship between the inputs A and A' to pulse generator 64 and the resulting output X is shown in FIG. 8.

To control the operation of main driver circuitry 44a and preemphasis driver circuitry 44b of FIG. 6, the output data signal A that is provided to input 14' may be inverted (using an inverter) to produce a corresponding inverted signal $\overline{A}$. A table showing the relationship between A, $\overline{A}$, and the resulting differential output $V_{OUT}$ produced across pins 28a and 28b is shown in FIG. 9.

Figure 10:
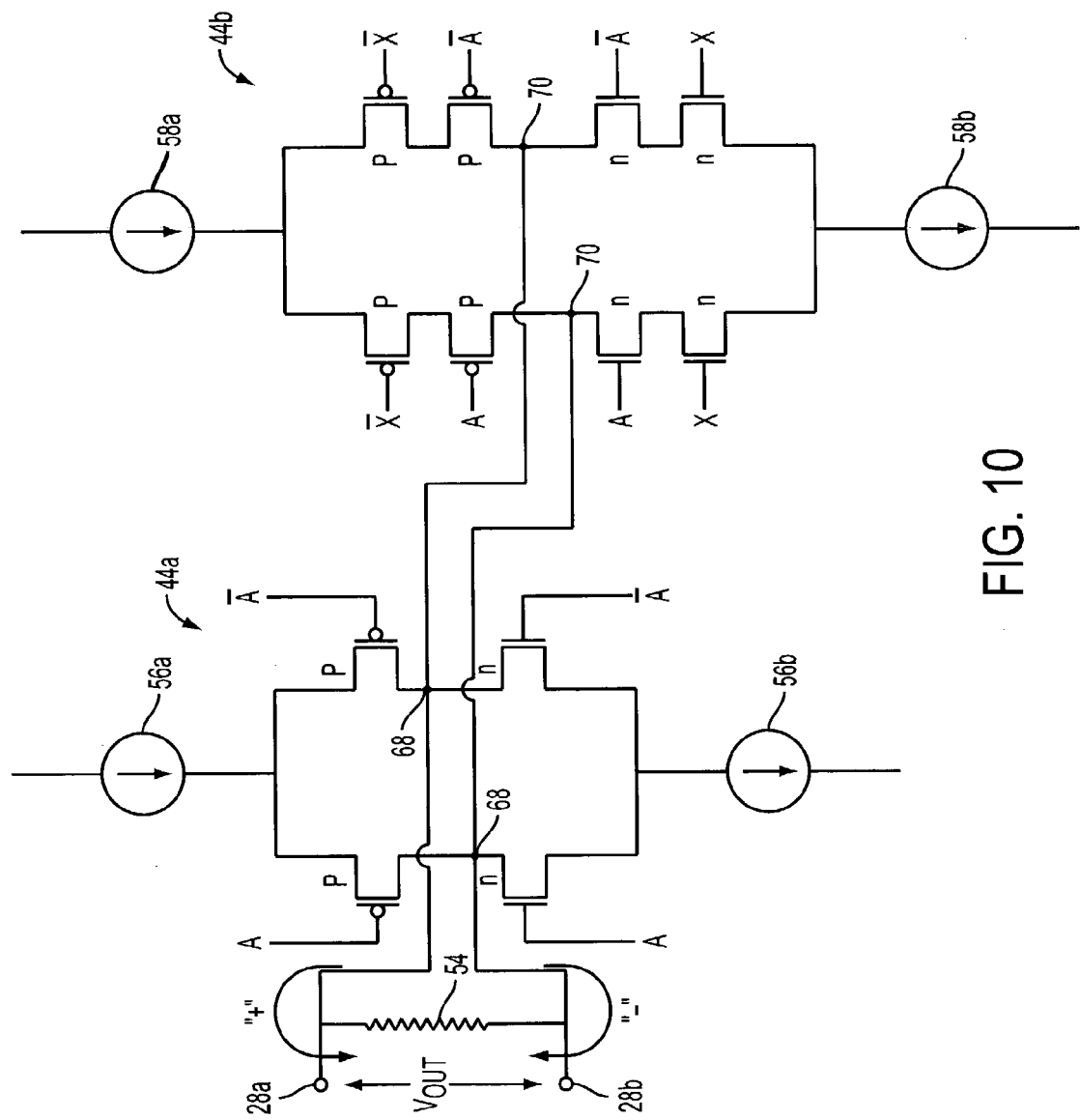
FIG. 10 is a circuit diagram of illustrative circuitry that may be used in the driver circuitry of FIG. 6 in accordance with the present invention.

Illustrative circuitry that may be used in drivers 44a and 44b is shown in FIG. 10. The example of FIG. 10 is based on n-type and p-type metal-oxide-semiconductor (MOS) transistors, but any type of transistor technology may be used if desired. As shown in FIG. 10, main driver 44a is controlled by data signal A and the inverted version of this signal $\overline{A}$. The resulting current flowing through resistor 54 from terminals 68 produces an output voltage $V_{OUT}$ across pins 28a and 28b shown by the solid line signal traces of FIG. 7. The delay pulse X (whose duration is programmably controlled by delay circuit 62) acts as a gating pulse that selectively switches extra preemphasis current of appropriate polarity into or out of resistor 54 via terminals 70 of preemphasis driver 44b.

The function control element arrangements of FIG. 6 that are used for controlling the components of I/O circuitry 16 are merely illustrative. Any suitable function control element arrangement may be used to adjust the differential drive signal settings (e.g., the output voltage swing $V_{OD}$ and the common mode voltage $V_{CM}$) to accommodate different desired I/O signaling standards and any suitable function control element arrangement may be used to provide selectable amounts of preemphasis (e.g., selective amounts of data signal slope steepening and selective preemphasis component durations).

Although the I/O circuitry described above provides significant flexibility when configuring device 10 for operation, there may be consequences of providing too much programmable circuitry in I/O circuitry 16. Accordingly, it may sometimes be desirable to replace some or all of the programmable circuitry in I/O circuits 16 with hardwired circuitry. For example, some or all of the output driver circuitry 44 may be replaced with output driver circuitry that is less adjustable than driver circuitry 44 on all or a portion of programmable logic device 10.

Figure 11:
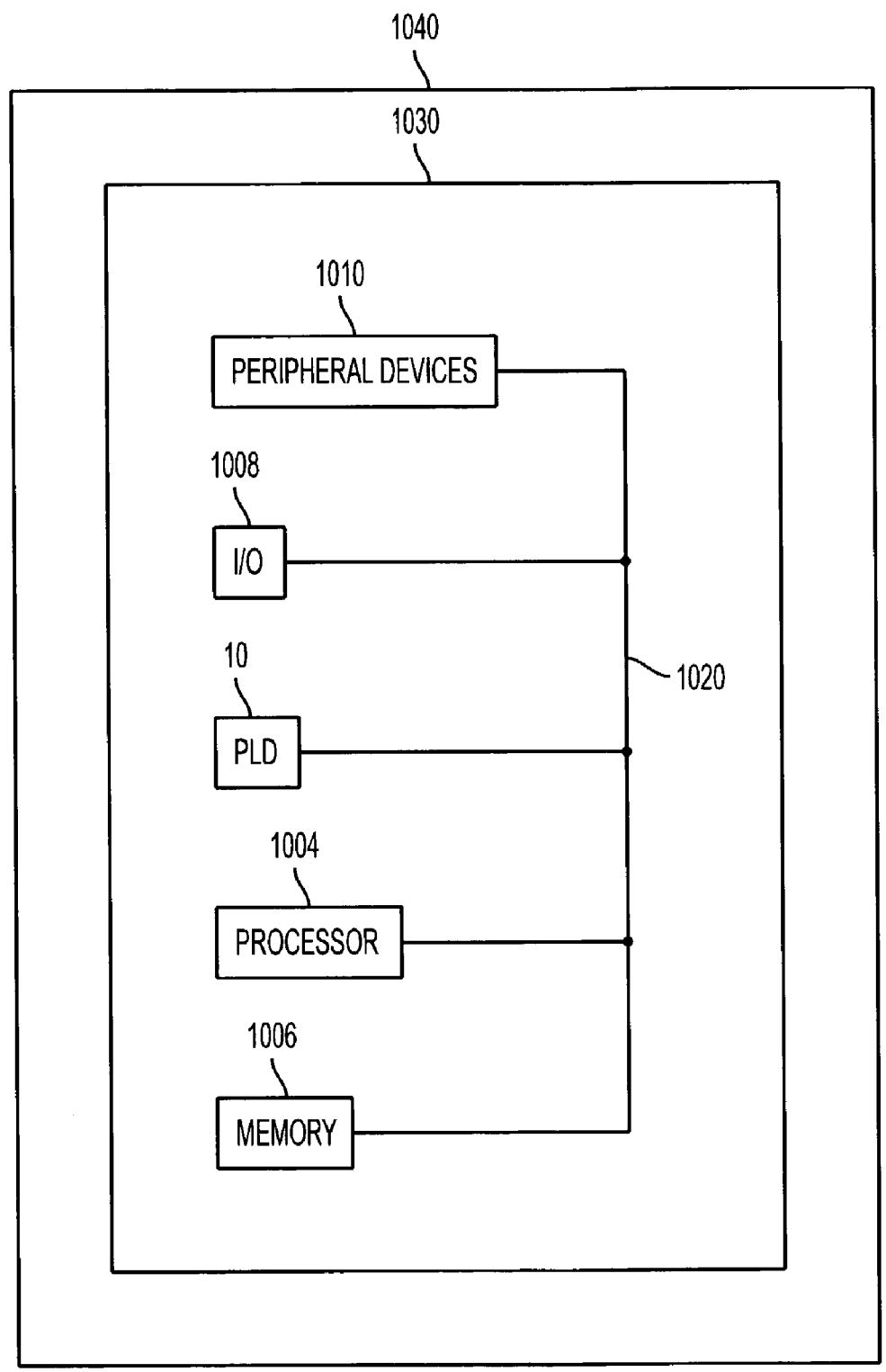
FIG. 11 is a simplified block diagram of an illustrative system employing a programmable logic device in accordance with the invention.

FIG. 11 illustrates a programmable logic device 10 of this invention in a data processing system 1002. Data processing system 1002 may include one or more of the following components: a processor 1004; memory 1006; I/O circuitry 1008; and peripheral devices 1010. These components are coupled together by a system bus 1020 and are populated on a circuit board 1030 which is contained in an end-user system 1040.

System 1002 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 1004. Programmable logic device 10 may also be used/as an arbiter for arbitrating access to a shared resource in system 1002. In yet another example, programmable logic device 10 can be configured as an interface between processor 1004 and one of the other components in system 1002. It should be noted that system 1002 is only exemplary, and that the true scope and spirit of the invention should be indicated by the following claims.

Various technologies can be used to implement programmable logic devices 10 having the features of this invention, as well as the various components of those devices (e.g., the above-described PLCs and the FCEs that control the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMS, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferroelectric memories, fuses, antifuses, or the like. From the various examples mentioned above it will be seen that this invention is applicable to both one-time-only programmable and reprogrammable devices.

It will be understood that the forgoing is only illustrative of the principles of the invention, and that various modifications can be made by those skilled in the art without departing from the scope and spirit of the invention. For example, the numbers of the various types of resources on device 10 can be different from the numbers present in the depicted and described illustrative embodiments. This applies to such parameters as the numbers of rows and columns of the various types of circuitry, the number of regions 12, the numbers of the various types of interconnection conductors, the number and types of I/O drivers, and the numbers and sizes of the FCEs used to control the circuitry. The logic used in programmable logic device 10 to perform various programmable logic functions may be look-up table logic. It will be understood that other types of logic may sometimes be used instead if desired. For example, sum-of-products logic may sometimes be used instead of look-up table logic. Although illustrated herein in the context of a particular programmable logic device architecture, it will be understood that various aspects of the invention are equally applicable to other programmable logic devices and integrated circuits as well.

The invention claimed is:

1. A programmable logic device integrated circuit that is programmable by a user and that has differential output driver circuitry for producing differential digital output data signals across a pair of output lines, comprising:
    main differential driver circuitry that produces the differential digital output data signals across the pair of output lines; and
    programmable preemphasis driver circuitry that is programmed by the user to contribute a desired amount of preemphasis to the differential digital output data signals, wherein the programmable preemphasis driver circuitry comprises programmable current supply circuitry that is programmable to adjust the preemphasis.

2. The programmable logic device defined in claim 1 wherein the programmable preemphasis driver circuitry comprises programmable delay circuitry that is programmed by the user to adjust the preemphasis.

3. The programmable logic device defined in claim 1 wherein the main differential driver circuitry is programmable to accommodate different high-speed differential I/O signaling standards.

4. The programmable logic device defined in claim 3 wherein the different differential I/O signaling standards include at least one signaling standard selected from the group of standards consisting of LVPECL, LVDS, and PCML.

5. The programmable logic device defined in claim 1 wherein the differential digital output data signals have data bits with an associated data bit duration, wherein the preemphasis that is contributed to the differential digital output data signals adds a preemphasis contribution of a given duration to the leading edge of each data bit, wherein the given duration is less than the bit duration, and wherein the preemphasis driver circuitry further comprises programmable circuitry that the user programs to adjust the given duration.

6. The programmable logic device defined in claim 5 wherein the given duration is programmable to be in the range of 100–500 ps.

7. The programmable logic device defined in claim 5 wherein the main differential driver circuitry is programmable so that the user may adjust the differential output driver circuitry to accommodate different high-speed differential I/O signaling standards.

8. The programmable logic device defined in claim 7 wherein the signaling standards include at least one high-speed differential signaling standard selected from the group consisting of LVPECL, LVDS, and PCML.

9. A programmable logic device integrated circuit that is programmable by a user and that has differential output driver circuitry for producing differential digital output data signals across a pair of output lines, comprising:
    main differential driver circuitry that produces the differential digital output data signals across the pair of output lines; and
    programmable preemphasis driver circuitry that is programmed by the user to contribute a desired amount of preemphasis to the differential digital output data signals, wherein the preemphasis that is contributed to the differential digital output data signals steepens the slope of transitions between data bits in the differential digital output data signals, and wherein the preemphasis driver circuitry further comprises programmable circuitry that the user programs to adjust how much slope steepening is provided by the preemphasis driver circuitry.

10. The programmable logic device defined in claim 9 wherein the programmable preemphasis driver circuitry comprises programmable delay circuitry that is programmed by the user to adjust the preemphasis.

11. The programmable logic device defined in claim 9 wherein the main differential driver circuitry is programmable to accommodate different high-speed differential I/O signaling standards.

12. The programmable logic device defined in claim 11 wherein the different differential I/O signaling standards include at least one signaling standard selected from the group of standards consisting of LVPECL, LVDS, and PCML.

13. The programmable logic device defined in claim 9 wherein the differential digital output data signals have data bits with an associated data bit duration, wherein the preemphasis that is contributed to the differential digital output data signals adds a preemphasis contribution of a given duration to the leading edge of each data bit, wherein the given duration is less than the bit duration, and wherein the preemphasis driver circuitry further comprises programmable circuitry that the user programs to adjust the given duration.

14. The programmable logic device defined in claim 13 wherein the given duration is programmable to be in the range of 100–500 ps.

15. The programmable logic device defined in claim 9 wherein the main differential driver circuitry is programmable so that the user may adjust the differential output driver circuitry to accommodate different high-speed differential I/O signaling standards.

* * * * *